(12) United States Patent
Lee

(10) Patent No.: US 11,594,578 B2
(45) Date of Patent: Feb. 28, 2023

(54) PIXEL ARRANGEMENT STRUCTURE FOR ORGANIC LIGHT EMITTING DISPLAY DEVICE

(71) Applicant: Samsung Display Co., Ltd., Yongin-si (KR)

(72) Inventor: Sang-Shin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/505,536

(22) Filed: Jul. 8, 2019

(65) Prior Publication Data
US 2019/0333970 A1    Oct. 31, 2019

Related U.S. Application Data

(63) Continuation of application No. 15/811,599, filed on Nov. 13, 2017, now Pat. No. 10,854,683, which is a continuation of application No. 13/614,197, filed on Sep. 13, 2012, now Pat. No. 9,818,803.

(30) Foreign Application Priority Data

Mar. 6, 2012   (KR) .................. 10-2012-0022967

(51) Int. Cl.
G09G 3/32    (2016.01)
H01L 27/32    (2006.01)

(52) U.S. Cl.
CPC ...... H01L 27/3216 (2013.01); H01L 27/3218 (2013.01)

(58) Field of Classification Search
CPC ................. H01L 27/3218; H01L 27/3216

USPC ................................................... 345/82, 419
See application file for complete search history.

(56) References Cited

U.S. PATENT DOCUMENTS

| | | | |
|---|---|---|---|
| 4,491,863 A | 1/1985 | Kurahashi |
| 4,642,619 A | 2/1987 | Togashi |
| 4,965,565 A | 10/1990 | Noguchi |
| 5,113,274 A | 5/1992 | Takahashi et al. |
| 5,142,392 A | 8/1992 | Ueki et al. |
| 5,461,503 A | 10/1995 | Deffontaines et al. |
| 5,485,293 A | 1/1996 | Robinder |

(Continued)

FOREIGN PATENT DOCUMENTS

| | | |
|---|---|---|
| CN | 1726593 A | 1/2006 |
| CN | 1874000 A | 12/2006 |

(Continued)

OTHER PUBLICATIONS

Office action issued in U.S. Appl. No. 15/811,599 by the USPTO, dated Jul. 19, 2019, 19 pages.

(Continued)

Primary Examiner — Kwang-Su Yang
(74) Attorney, Agent, or Firm — Lewis Roca Rothgerber Christie LLP

(57) ABSTRACT

A pixel arrangement structure of an OLED display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square.

92 Claims, 5 Drawing Sheets

(56) References Cited

U.S. PATENT DOCUMENTS

| | | | |
|---|---|---|---|
| 5,742,129 A | 4/1998 | Nagayama et al. | |
| 6,198,507 B1 | 3/2001 | Ishigami | |
| 6,326,981 B1 | 12/2001 | Mori et al. | |
| 6,366,025 B1 | 4/2002 | Yamada | |
| 6,552,706 B1 | 4/2003 | Ikeda et al. | |
| 6,747,618 B2 | 6/2004 | Arnold et al. | |
| 6,838,819 B2 | 1/2005 | Kim et al. | |
| 6,867,549 B2 | 3/2005 | Cok et al. | |
| 6,882,364 B1 | 4/2005 | Inuiya et al. | |
| 6,933,976 B1 | 8/2005 | Suzuki | |
| 6,950,115 B2 | 9/2005 | Brown Elliott | |
| 7,075,242 B2 | 7/2006 | Miller et al. | |
| 7,110,031 B2 * | 9/2006 | Kondo | H04N 9/045 348/272 |
| 7,187,425 B2 | 3/2007 | Yamazaki | |
| 7,215,347 B2 * | 5/2007 | Phan | G09G 3/2074 345/694 |
| 7,230,594 B2 | 6/2007 | Miller et al. | |
| 7,274,383 B1 | 9/2007 | Brown Elliot | |
| 7,291,970 B2 | 11/2007 | Kuwabara | |
| 7,301,273 B2 | 11/2007 | Dedene et al. | |
| 7,397,485 B2 | 7/2008 | Miller et al. | |
| 7,612,811 B2 * | 11/2009 | Takeuchi | H01L 27/14621 348/272 |
| 7,646,430 B2 * | 1/2010 | Brown Elliott | G06T 3/4023 348/458 |
| 7,710,484 B2 * | 5/2010 | Oda | H04N 5/3728 348/297 |
| 7,755,652 B2 | 7/2010 | Credelle et al. | |
| 7,982,786 B2 * | 7/2011 | Nishida | G02B 5/008 348/272 |
| 8,026,669 B2 | 9/2011 | Kawasaki et al. | |
| 8,118,633 B2 | 2/2012 | Yuasa | |
| 8,134,583 B2 | 3/2012 | Credelle | |
| 8,294,741 B2 | 10/2012 | Brown Elliott et al. | |
| 8,330,352 B2 | 12/2012 | Sung et al. | |
| 8,334,859 B2 | 12/2012 | Liu et al. | |
| 8,350,468 B2 | 1/2013 | Ko et al. | |
| 8,354,789 B2 | 1/2013 | Kim et al. | |
| 8,363,072 B2 | 1/2013 | Hong et al. | |
| 8,395,157 B2 | 3/2013 | Park et al. | |
| 8,405,692 B2 | 3/2013 | Brown Elliott et al. | |
| 8,456,496 B2 | 6/2013 | Credelle | |
| 8,519,910 B2 | 8/2013 | Park et al. | |
| 8,519,917 B2 | 8/2013 | Ryu et al. | |
| 8,552,635 B2 | 10/2013 | Kim et al. | |
| 8,587,003 B2 | 11/2013 | Ando | |
| 8,754,913 B2 | 6/2014 | Hwang et al. | |
| 8,853,016 B2 | 10/2014 | Park et al. | |
| 8,866,707 B2 | 10/2014 | Koyama et al. | |
| 8,883,532 B2 | 11/2014 | Ando | |
| 9,041,625 B2 | 5/2015 | Hwang et al. | |
| 9,398,205 B2 * | 7/2016 | Cote | H04N 9/04557 |
| 9,431,469 B2 | 8/2016 | Park et al. | |
| 9,837,476 B2 | 12/2017 | Park et al. | |
| 10,403,211 B2 | 9/2019 | Hai et al. | |
| 10,854,683 B2 | 12/2020 | Lee | |
| 2002/0015110 A1 | 2/2002 | Brown Elliott | |
| 2002/0070909 A1 | 6/2002 | Asano et al. | |
| 2002/0113195 A1 | 8/2002 | Osada | |
| 2002/0140833 A1 | 10/2002 | Hirai | |
| 2003/0117423 A1 | 6/2003 | Brown-Elliott et al. | |
| 2003/0128179 A1 | 7/2003 | Credelle | |
| 2003/0128225 A1 * | 7/2003 | Credelle | G02F 1/133514 345/694 |
| 2003/0218618 A1 | 11/2003 | Phan | |
| 2004/0036421 A1 | 2/2004 | Arnold et al. | |
| 2004/0046714 A1 | 3/2004 | Brown Elliott | |
| 2004/0108818 A1 | 6/2004 | Cok et al. | |
| 2004/0113875 A1 | 6/2004 | Miller et al. | |
| 2004/0183764 A1 | 9/2004 | Kim et al. | |
| 2004/0246426 A1 | 12/2004 | Wang et al. | |
| 2005/0001542 A1 | 1/2005 | Kiguchi | |
| 2005/0162079 A1 | 7/2005 | Sakamoto | |
| 2005/0225575 A1 | 10/2005 | Elliott et al. | |
| 2006/0119738 A1 | 6/2006 | Kido | |
| 2006/0152531 A1 | 7/2006 | Lin et al. | |
| 2007/0164335 A1 * | 7/2007 | McKee | H01L 27/14641 438/70 |
| 2007/0230818 A1 * | 10/2007 | Messing | G09G 3/2003 382/275 |
| 2008/0001525 A1 | 1/2008 | Chao et al. | |
| 2008/0001527 A1 | 1/2008 | Koo et al. | |
| 2008/0018765 A1 | 1/2008 | Choi et al. | |
| 2008/0273793 A1 | 11/2008 | Oishi | |
| 2008/0308819 A1 | 12/2008 | Louwsma et al. | |
| 2009/0027377 A1 | 1/2009 | Kwon | |
| 2009/0302331 A1 | 12/2009 | Smith et al. | |
| 2009/0321727 A1 | 12/2009 | Yutani et al. | |
| 2010/0033084 A1 | 2/2010 | Ko et al. | |
| 2010/0045695 A1 * | 2/2010 | Brown Elliott | G09G 3/2003 345/589 |
| 2010/0117528 A1 * | 5/2010 | Fukuda | H01L 27/322 313/505 |
| 2010/0117936 A1 * | 5/2010 | Lhee | H01L 27/3211 345/76 |
| 2010/0133994 A1 | 6/2010 | Song et al. | |
| 2010/0171440 A1 | 7/2010 | Satou et al. | |
| 2010/0253608 A1 | 10/2010 | Kim et al. | |
| 2010/0315318 A1 | 12/2010 | Lee et al. | |
| 2011/0012820 A1 | 1/2011 | Kim et al. | |
| 2011/0018858 A1 | 1/2011 | Ryu et al. | |
| 2011/0084955 A1 | 4/2011 | Kim | |
| 2011/0115772 A1 | 5/2011 | Chung | |
| 2011/0177640 A1 | 7/2011 | Han et al. | |
| 2011/0215302 A1 * | 9/2011 | Lhee | H01L 51/5265 257/40 |
| 2011/0216056 A1 | 9/2011 | Yoo et al. | |
| 2011/0260951 A1 | 10/2011 | Hwang et al. | |
| 2011/0291549 A1 | 12/2011 | Kim et al. | |
| 2011/0291550 A1 | 12/2011 | Kim et al. | |
| 2011/0298836 A1 | 12/2011 | Komiya et al. | |
| 2011/0316892 A1 | 12/2011 | Sung et al. | |
| 2012/0049726 A1 | 3/2012 | Yoo et al. | |
| 2012/0056531 A1 | 3/2012 | Park et al. | |
| 2012/0086330 A1 | 4/2012 | Umeda et al. | |
| 2012/0176298 A1 | 7/2012 | Suh et al. | |
| 2012/0287605 A1 | 11/2012 | Chen et al. | |
| 2012/0313844 A1 | 12/2012 | Im et al. | |
| 2012/0319564 A1 | 12/2012 | Ghosh et al. | |
| 2013/0002911 A1 | 1/2013 | Miyashita et al. | |
| 2013/0037827 A1 | 2/2013 | Levermore et al. | |
| 2013/0057521 A1 | 3/2013 | Kim | |
| 2013/0106891 A1 * | 5/2013 | Matsueda | G09G 3/2003 345/589 |
| 2013/0127689 A1 | 5/2013 | Collier | |
| 2014/0191202 A1 | 7/2014 | Shim et al. | |
| 2015/0187273 A1 | 7/2015 | Chang et al. | |
| 2015/0192834 A1 | 7/2015 | Morinaga et al. | |
| 2016/0124557 A1 | 5/2016 | Choi | |
| 2016/0171930 A1 | 6/2016 | Song et al. | |
| 2016/0190166 A1 | 6/2016 | Kim et al. | |
| 2019/0333970 A1 | 10/2019 | Lee | |
| 2020/0394955 A1 | 12/2020 | Lee | |
| 2022/0319406 A1 | 10/2022 | Lee | |

FOREIGN PATENT DOCUMENTS

| | | |
|---|---|---|
| CN | 101009304 A | 8/2007 |
| CN | 100439989 C | 12/2008 |
| CN | 100448020 C | 12/2008 |
| CN | 101449382 A | 6/2009 |
| CN | 102354479 A | 2/2012 |
| CN | 103311266 A | 9/2013 |
| CN | 203260586 U | 10/2013 |
| CN | 105206647 A | 12/2015 |
| EP | 0 322 106 A2 | 6/1989 |
| EP | 1168448 A2 | 1/2002 |
| EP | 1450408 A2 | 8/2004 |
| EP | 2 637 209 A1 | 9/2013 |
| GB | 2 437 110 A | 10/2007 |
| JP | 02-000826 A | 1/1990 |

(56) References Cited

FOREIGN PATENT DOCUMENTS

| | | |
|---|---|---|
| JP | 03-078390 A | 4/1991 |
| JP | 3-36239 | 5/1991 |
| JP | 8-227276 A | 9/1996 |
| JP | 08-335060 A | 12/1996 |
| JP | 09-182091 A | 7/1997 |
| JP | 10-39791 | 2/1998 |
| JP | 2000-235891 | 8/2000 |
| JP | 2001-33757 A | 2/2001 |
| JP | 2001-54127 A | 2/2001 |
| JP | 2001-76881 A | 3/2001 |
| JP | 3203907 B2 | 9/2001 |
| JP | 2001-290441 A | 10/2001 |
| JP | 2003-203770 A | 7/2003 |
| JP | 2004-507773 | 3/2004 |
| JP | 2004-179028 A | 6/2004 |
| JP | 2004-192813 | 7/2004 |
| JP | 2005-5227 A | 1/2005 |
| JP | 2005-62416 A | 3/2005 |
| JP | 2005-63787 A | 3/2005 |
| JP | 2005-515505 A | 5/2005 |
| JP | 2006-18195 A | 1/2006 |
| JP | 2006-163316 A | 6/2006 |
| JP | 2006-309182 | 11/2006 |
| JP | 2007-156126 A | 6/2007 |
| JP | 2008-015521 | 1/2008 |
| JP | 2008-277264 A | 11/2008 |
| JP | 2008-298966 A | 12/2008 |
| JP | 2008-300367 | 12/2008 |
| JP | 2009-230096 A | 10/2009 |
| JP | 2010-3880 A | 1/2010 |
| JP | 2010-153173 A | 7/2010 |
| JP | 2011-076760 | 4/2011 |
| JP | 2011-198761 A | 10/2011 |
| JP | 2012-15129 A | 1/2012 |
| JP | 2012-19206 A | 1/2012 |
| JP | 2012-028170 A | 2/2012 |
| JP | 2012-79631 A | 4/2012 |
| JP | 5177957 B2 | 4/2013 |
| KR | 10-2004-0096706 A | 11/2004 |
| KR | 10-2006-0118868 A | 11/2006 |
| KR | 10-0742370 B1 | 7/2007 |
| KR | 10-0807524 | 2/2008 |
| KR | 10-2008-0111130 | 12/2008 |
| KR | 10-2009-0017910 | 2/2009 |
| KR | 10-2009-0049515 A | 5/2009 |
| KR | 10-2011-0023996 | 3/2011 |
| KR | 10-2011-0039773 A | 4/2011 |
| KR | 10-1056258 B1 | 8/2011 |
| KR | 10-2011-0106565 | 9/2011 |
| KR | 10-2011-0108050 A | 10/2011 |
| KR | 10-2011-0117613 A | 10/2011 |
| KR | 10-2011-0129531 | 12/2011 |
| KR | 10-2012-0000887 A | 1/2012 |
| KR | 10-2012-0014074 A | 2/2012 |
| KR | 10-2012-0022967 | 3/2012 |
| KR | 10-1332495 B1 | 11/2013 |
| KR | 10-2020-0000840 A | 1/2020 |
| TW | 200305126 A | 10/2003 |
| TW | I277930 B | 4/2007 |
| TW | I328207 | 8/2010 |
| WO | WO 03/053068 A2 | 6/2003 |
| WO | WO 03/060870 A1 | 7/2003 |
| WO | WO 2004/073356 A1 | 8/2004 |
| WO | WO 2005/067352 A1 | 7/2005 |

OTHER PUBLICATIONS

English Abstract of TW 2008-02221 A, also published as TW I328207.
EPO Search Report dated Jul. 8, 2013, for corresponding European Patent application 13157562.3, (6 pages).
EPO Search Report dated Dec. 20, 2013 for European Patent application 13178648.5, (9 pages).
EPO Search Report dated Jul. 9, 2014, for European Patent application 14155124.2, (8 pages).
JPO Office action dated Feb. 16, 2016, for corresponding Japanese Patent application 2012-108855, (5 pages).
Korean Patent Abstracts, Publication No. 1020030031207A, dated Apr. 21, 2003 for corresponding Korean Patent 10-0807524.
Korean Patent Abstracts for Korean Publication 1020070055908 dated May 31, 2007, to Korean Patent 10-0742370 dated Jul. 24, 2007.
KIPO Office action dated Jul. 11, 2016, with English translation, for corresponding Korean Patent application 10-2016-0047800, (11 pages).
SIPO Office action dated Mar. 11, 2015, for corresponding Chinese Patent application 201310035429.X, (7 pages).
Taiwan Office action dated Mar. 30, 2015, for corresponding Taiwanese Patent application 102101000, (7 pages).
TIPO Office Action dated Oct. 11, 2016, for corresponding Taiwanese Patent Application No. 102124953 (6 pages).
EPO Communication Pursuant to Article 94(3) EPC, for Patent Application No. 13 178 648.5, dated Jan. 31, 2019, 8 pages.
U.S. Office action dated Aug. 29, 2014, for cross reference U.S. Appl. No. 14/059,356, (18 pages).
U.S. Office action dated Jun. 30, 2015, for cross reference U.S. Appl. No. 13/872,018, (22 pages).
U.S. Office action dated Oct. 16, 2015, for cross reference U.S. Appl. No. 13/872,018, (16 pages).
U.S. Office action dated Feb. 29, 2016, for cross reference U.S. Appl. No. 13/872,018, (15 pages).
U.S. Office action dated Aug. 5, 2016, for related U.S. Appl. No. 15/090,591 (11 pages).
U.S. Office Action dated Sep. 2, 2016 for U.S. Appl. No. 13/872,018 (15 sheets).
U.S. Office Action dated May 11, 2017, issued in cross-reference U.S. Appl. No. 13/872,018 (16 pages).
U.S. Office Action dated Mar. 19, 2018, issued in U.S. Appl. No. 15/688,760 (13 pages).
U.S. Office Action dated Sep. 3, 2019, issued in U.S. Appl. No. 16/261,437 (11 pages).
U.S. Office Action dated Oct. 21, 2020, issued in U.S. Appl. No. 16/882,384 (24 pages).
U.S. Office Action dated Apr. 13, 2021, issued in U.S. Appl. No. 17/005,753 (22 pages).
U.S. Final Office Action dated Nov. 24, 2021, issued in U.S. Appl. No. 17/005,753 (13 pages).
U.S. Office Action dated Nov. 3, 2022, issued in U.S. Appl. No. 17/808,984 (25 pages).
U.S. Office Action dated Nov. 10, 2022, issued in U.S. Appl. No. 17/865,304 (23 pages).
Chinese Office Action dated Sep. 13, 2022, issued in corresponding Chinese Patent Application No. 201910040602.2 (9 pages).
U.S. Office Action dated Oct. 14, 2022, issued in U.S. Appl. No. 17/808,982 (25 pages).
U.S. Office Action dated Oct. 14, 2022, issued in U.S. Appl. No. 17/808,983 (23 pages).
U.S. Office Action dated Sep. 19, 2022, issued in U.S. Appl. No. 17/808,985 (25 pages).
U.S. Office Action dated Jul. 8, 2022, issued in U.S. Appl. No. 17/005,753 (48 pages).
U.S. Restriction Requirement from U.S. Appl. No. 13/614,197, dated Aug. 18, 2014, 7 pages.
U.S. Advisory Action from U.S. Appl. No. 13/614,197, dated May 18, 2015, 3 pages.
U.S. Office Action from U.S. Appl. No. 13/614,197, dated Dec. 2, 2015, 11 pages.
U.S. Advisory Action from U.S. Appl. No. 13/614,197, dated Feb. 5, 2016, 3 pages.
U.S. Ex Parte Quayle Action from U.S. Appl. No. 13/614,197, dated Jan. 5, 2017, 5 pages.
U.S. Notice of Allowance from U.S. Appl. No. 13/614,197, dated Mar. 22, 2017, 7 pages.
U.S. Notice of Allowance from U.S. Appl. No. 13/614,197, dated Jul. 11, 2017, 7 pages.

(56) References Cited

OTHER PUBLICATIONS

U.S. Restriction Requirement from U.S. Appl. No. 13/872,018, dated Nov. 5, 2014, 8 pages.
U.S. Office Action from U.S. Appl. No. 13/872,018, dated Oct. 16, 2015, 15 pages.
U.S. Advisory Action from U.S. Appl. No. 13/872,018, dated Dec. 8, 2015, 3 pages.
U.S. Office Action from U.S. Appl. No. 13/872,018, dated Jun. 23, 2016, 12 pages.
U.S. Advisory Action from U.S. Appl. No. 13/872,018, dated Nov. 14, 2016, 3 pages.
U.S. Patent Board Decision from U.S. Appl. No. 13/872,018, dated Dec. 2, 2019, 8 pages.
U.S. Notice of Allowance from U.S. Appl. No. 13/872,018, dated Feb. 19, 2020, 5 pages.
U.S. Notice of Allowance from U.S. Appl. No. 13/872,018, dated May 28, 2020, 5 pages.
U.S. Office Action from U.S. Appl. No. 14/059,356, dated Jun. 18, 2015, 15 pages.
U.S. Notice of Allowance from U.S. Appl. No. 14/059,356, dated Sep. 10, 2015, 5 pages.
U.S. Notice of Allowance from U.S. Appl. No. 14/059,356, dated Nov. 25, 2015, 5 pages.
U.S. Notice of Allowance from U.S. Appl. No. 14/059,356, dated Apr. 27, 2016, 5 pages.
U.S. Notice of Allowance from U.S. Appl. No. 15/090,591, dated Feb. 13, 2017, 5 pages.
U.S. Notice of Allowance from U.S. Appl. No. 15/688,760, dated Sep. 14, 2018, 5 pages.
U.S. Notice of Allowance from U.S. Appl. No. 15/688,760, dated Jan. 30, 2019, 5 pages.
U.S. Restriction Requirement from U.S. Appl. No. 15/811,599, dated Mar. 28, 2018, 7 pages.
U.S. Notice of Allowance from U.S. Appl. No. 15/811,599, dated Feb. 14, 2019, 7 pages.
U.S. Office Action from U.S. Appl. No. 15/811,599, dated Jan. 21, 2020, 18 pages.
U.S. Notice of Allowance from U.S. Appl. No. 15/811,599, dated Mar. 31, 2020, 5 pages.
U.S. Notice of Allowance from U.S. Appl. No. 15/811,599, dated Jul. 10, 2020, 5 pages.
U.S. Notice of Allowance from U.S. Appl. No. 16/261,437, dated Jan. 10, 2020, 6 pages.
U.S. Notice of Allowance from U.S. Appl. No. 16/261,437, dated Apr. 27, 2020, 5 pages.
U.S. Notice of Allowance from U.S. Appl. No. 16/261,437, dated Aug. 14, 2020, 5 pages.
U.S. Notice of Allowance from U.S. Appl. No. 16/261,437, dated Dec. 28, 2020, 5 pages.
Decision by the Intellectual Property Trial and Appeal Board (IPTAB) of the Korean Intellectual Property Office (KIPO) on Patent Cancellation Request of Korean Patent No. KR 2115531 (corresponding to U.S. Pat. No. 9,818,803) dated Mar. 16, 2021, 12 pages.
English translation of Decision by the Intellectual Property Trial and Appeal Board (IPTAB) of the Korean Intellectual Property Office (KIPO) on Patent Cancellation Request of Korean Patent No. KR 2115531 (corresponding to U.S. Pat. No. 9,818,803) dated Mar. 16, 2021, 15 pages.
English translation of Petition for Patent Invalidation of Chinese Patent No. ZL201310035429.X (corresponding to U.S. Pat. No. 9,818,803) dated Dec. 22, 2020, 31 pages.
English translation of Petition for Patent Invalidation of Chinese Patent No. ZL201510595095.0 (corresponding to U.S. Pat. No. 9,818,803) dated Jan. 22, 2021, 26 pages.
U.S. Final Office Action dated Jan. 4, 2023, issued in U.S. Appl. No. 17/808,985 (27 pages).

* cited by examiner

PIXEL ARRANGEMENT STRUCTURE FOR ORGANIC LIGHT EMITTING DISPLAY DEVICE

CROSS-REFERENCE TO RELATED PATENT APPLICATION

This application is a continuation of U.S. patent application Ser. No. 15/811,599, filed Nov. 13, 2017, which is a continuation of U.S. patent application Ser. No. 13/614,197, filed Sep. 13, 2012, now U.S. Pat. No. 9,818,803, which claims priority to and the benefit of Korean Patent Application No. 10-2012-0022967, filed Mar. 6, 2012, the entire content of all of which is incorporated herein by reference.

BACKGROUND

1. Field

Aspects of embodiments of the present invention relate generally to a pixel arrangement structure of an organic light emitting diode (OLED) display.

2. Description of the Related Art

A display device is a device that displays an image. Recently, an OLED display has been drawing attention. The OLED display has a self-luminous characteristic. Because the OLED display does not need a separate light source, unlike a liquid crystal display, it can have a relatively smaller thickness and weight than liquid crystal displays. In addition, the OLED display exhibits high-quality characteristics such as low power consumption, high luminance, high response speed, etc.

In general, the OLED display includes a plurality of pixels for emitting light of different colors. The plurality of pixels emit light to display an image. Here, the pixel refers to a minimum unit for displaying the images. For instance, there may be a gate line, a data line, and a power line such as a driving power line to drive each pixel. In addition, there may be an insulation layer such as a pixel definition layer to define an area and a shape of each pixel. Further, each pixel may be positioned between its neighboring pixels.

An organic emission layer included in the pixel of an OLED display may be deposited and formed by using a mask such as a fine metal mask (FMM). When reducing a gap between the neighboring pixels to obtain a high aperture ratio of the pixel, deposition reliability may be deteriorated. On the other hand, when increasing the gap between the pixels to improve the deposition reliability, the aperture ratio of the pixel may be deteriorated.

The above information disclosed in this Background section is only for enhancement of understanding of the background of the invention. Therefore, it may contain information that does not form the prior art that is already known in this country to a person of ordinary skill in the art.

SUMMARY

Aspects of embodiments of the present invention relate generally to a pixel arrangement structure of an OLED display. More particularly, aspects relate to a pixel arrangement structure of an OLED display for displaying images by emitting light through a plurality of pixels. An exemplary embodiment of the present invention provides a pixel arrangement structure for an OLED display having an improved aperture ratio of a pixel while efficiently setting up a gap between the pixels.

According to an exemplary embodiment of the present invention, a pixel arrangement structure of an organic light emitting diode display is provided. The pixel arrangement structure includes: a first pixel having a center coinciding with a center of a virtual square; a second pixel separated from the first pixel and having a center at a first vertex of the virtual square; and a third pixel separated from the first pixel and the second pixel, and having a center at a second vertex neighboring the first vertex of the virtual square.

The second pixel may include a pair of second pixels. The second pixels may be separated from each other by the first pixel.

The third pixel may include a pair of third pixels. The third pixels may be separated from each other by the first pixel.

The second pixels and the third pixels may enclose the first pixel in the virtual square.

The first pixel, the second pixels, and the third pixels may have polygonal shapes. The second pixels and the third pixels may have a larger area than the first pixel.

The first pixel may have a quadrilateral shape. The second pixels and the third pixels may have hexagonal or octagonal shapes.

The second pixels and the third pixels may have octagonal shapes.

The second pixels and the third pixels may have a same area. A distance between the first pixel and the second pixels, a distance between the first pixel and the third pixels, and a distance between the second pixels and the third pixels may be a same first length.

The first pixel may include a plurality of first pixels. The plurality of first pixels may have a same quadrilateral shape. A distance between neighboring ones of the plurality of first pixels may be a second length that is longer than the first length.

The second pixels may have a larger area than the third pixels. A distance between the second pixels and the third pixels may be a first length. A distance between the first pixel and the second pixels, and a distance between the first pixel and the third pixels may be a same second length.

The first pixel may include a plurality of first pixels. The plurality of first pixels may have a same quadrilateral shape. A distance between neighboring ones of the plurality of first pixels may be a third length that is longer than the first length and the second length.

The first pixel may include a plurality of first pixels. Neighboring ones of the plurality of first pixels may have quadrilateral shapes that are symmetrical to each other. A distance between the neighboring ones of the plurality of first pixels may be a third length that is longer than the first length and the second length.

The first pixel may include a plurality of first pixels. Neighboring ones of the plurality of first pixels may have quadrilateral shapes that are symmetrical to each other.

The second pixels may have a larger area than the third pixels.

The third pixels may have a larger area than the second pixels.

The first pixel, the second pixel, and the third pixel may be configured to emit different color lights.

The first pixel, the second pixel, and the third pixel may be configured to emit green light, blue light, and red light, respectively.

According to an exemplary embodiment of the present invention, the pixel arrangement structure of the OLED display improves the aperture ratio of the pixel while efficiently setting up the gap between the pixels.

DETAILED DESCRIPTION

Figure 1:
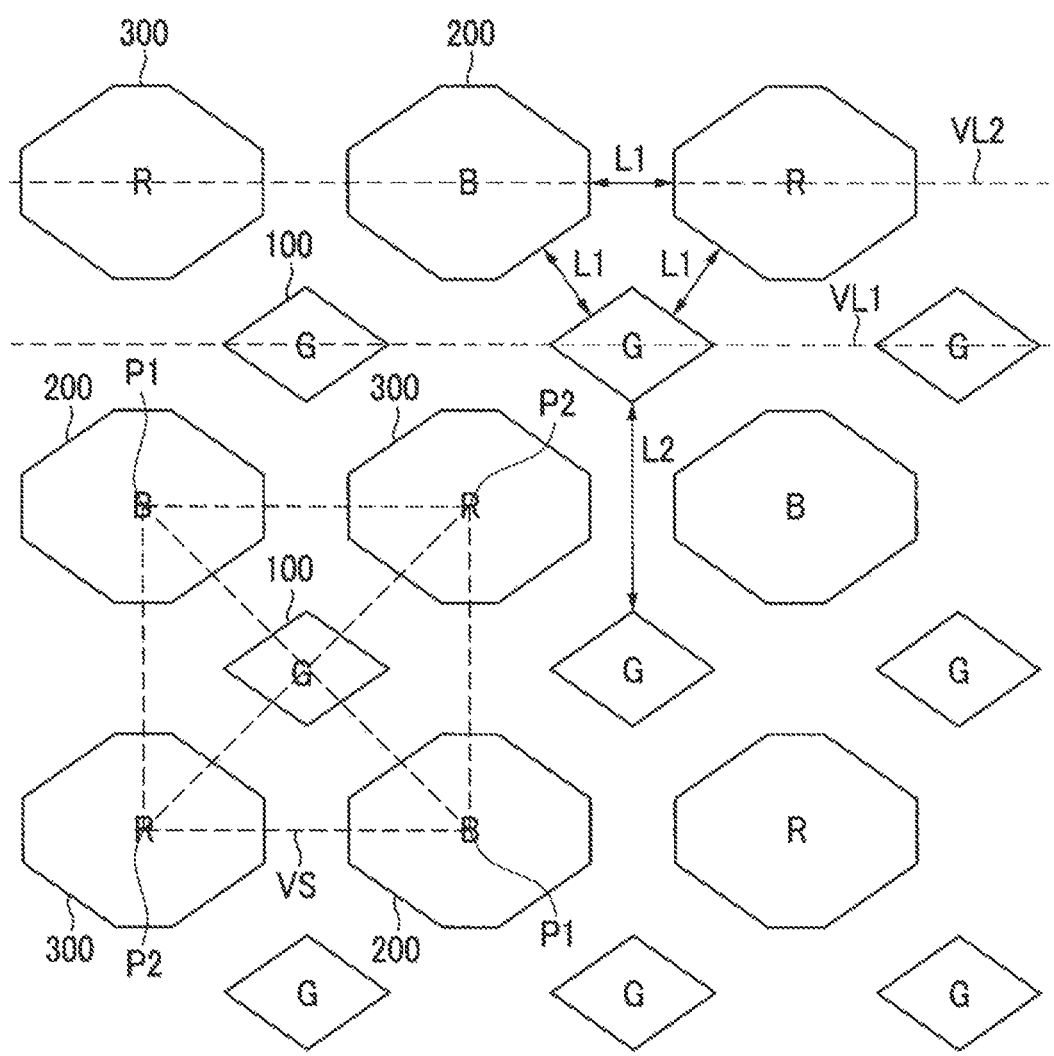
FIG. 1 is a view of a pixel arrangement structure of an OLED display according to a first exemplary embodiment.

Several exemplary embodiments according to the present invention are described hereinafter in detail with reference to the accompanying drawings to allow one of a person of ordinary skill in the art to practice the invention without undue experimentation. The present invention can be embodied in several different forms, and is not limited to exemplary embodiments that are described herein.

In order to clarify the description of embodiments of the present invention, parts that are not related to the embodiments may be omitted. In addition, the same elements or equivalents are referred to with the same reference numerals throughout the specification. For example, the same reference numerals are used for the elements having the same constructions throughout. Such elements are representatively described in a first exemplary embodiment, and in remaining exemplary embodiments, only different constructions from those of the first exemplary embodiment may be described.

Further, since sizes and thicknesses of constituent members shown in the accompanying drawings are arbitrarily given for better understanding and ease of description, the present invention is not limited to the illustrated sizes and thicknesses. In addition, unless explicitly described to the contrary, the word "comprise" and variations such as "comprises" or "comprising" will be understood to imply the inclusion of stated elements but not the exclusion of any other elements.

Nevertheless, even though each of the pixels are drawn as stereotypical polygonal shapes in the drawings, the present invention is not limited to this shape. That is, the shapes of the pixels may be modified to avoid interference with the other components of the OLED (e.g., wirings) within the spirit and scope of the appended claims.

A pixel arrangement structure (or pixel arrangement) of an OLED display according to a first exemplary embodiment will be described with reference to FIG. 1. FIG. 1 is a view schematically showing a portion of pixels forming an OLED display.

As shown in FIG. 1, the pixel arrangement structure of the OLED display includes a plurality of first pixels 100, a plurality of second pixels 200, and a plurality of third pixels 300. Here, the pixel refers to a minimum unit for displaying an image (for example, the minimum addressable unit of the display).

Further, among the first pixels 100, the second pixels 200, and the third pixels 300, power lines for driving each of the pixels, such as a gate line, a data line, a driving power line, and the like, may be located. In addition, an insulation layer, such as a pixel defining layer, for defining each of the pixels may be disposed. Finally, an OLED including an anode, an organic emission layer, and a cathode to correspond to each of the first pixels 100, the second pixels 200, and the third pixels 300 may be disposed. These configurations are technologies known in the art and further description thereof is omitted for ease of description. A shape of each of the pixels may be defined by the power lines, the pixel defining layer, the anode, or the like, but is not limited thereto.

In the pixel arrangement of FIG. 1, each of the first pixels 100 has a smaller area than neighboring second pixels 200 and third pixels 300, and has a quadrilateral (i.e., four-sided) shape among polygon shapes. For example, in the pixel arrangement of FIG. 1, each of the first pixels 100 has the same quadrilateral shape (e.g., a square or rhombus). The first pixels 100 are spaced apart from each other and arranged in rows, such as along a first virtual straight line VL1. The first pixels 100 emit green light, and may include an organic emission layer for emitting green light.

The second pixels 200 are arranged diagonally with respect to the first pixels 100, such as at first vertices P1 along one diagonal of a virtual square VS having one of the first pixels 100 as a center point (or center) of the virtual square VS. In a similar fashion, the third pixels 300 are arranged diagonally with respect to the first pixels 100, such as at second vertices P2 along the other diagonal of the virtual square VS.

In the virtual square VS, each of the second pixels 200 is separated from the first pixel 100, and is centered at one of the first vertices P1 of the virtual square VS. Each of the second pixels 200 has a larger area than the neighboring first pixel 100 and has an octagonal (i.e., eight-sided) shape. In FIG. 1, the second pixels 200 each have the same octagonal shape. In addition, the second pixels 200 are arranged diagonally and separated from each other by the first pixels 100. The second pixels 200 emit blue light, and may include an organic emission layer for emitting blue light.

In a similar fashion, in the virtual square VS, each of the third pixels 300 is separated from the first pixel 100 and the second pixels 200, and is centered at one of the second vertices P2 neighboring the first vertices P1 of the virtual square VS. Each of the third pixels 300 has a larger area than the neighboring first pixel 100 and the same area as each of the second pixels 200. Further, the third pixels have an octagonal shape (e.g., similar to or the same as the second pixels 200). In FIG. 1, the third pixels 300 each have the same octagonal shape. In addition, the third pixels 300 are arranged diagonally and separated from each other by the first pixels 100. The third pixels 300 emit red light, and may include an organic emission layer for emitting red light.

The third pixels 300 and the second pixels 200 are spaced apart from each other and alternately arranged in rows, such as along a second virtual straight line VL2. In a similar fashion, the third pixels 300 and the second pixels 200 are spaced apart from each other and alternately arranged in columns. Accordingly, in the virtual square VS, two of the second pixels 200 having their corresponding centers positioned at the first vertices P1 and two of the third pixels 300 having their corresponding centers positioned at the second vertices P2 to enclose a corresponding one of the first pixels 100 (e.g., in the virtual square VS).

As described above, the center of each of the second pixels 200 is positioned at one of the first vertices P1 of the virtual square VS. In addition, the center of the corresponding first pixel 100 is the center of the virtual square VS. Further, the center of each of the third pixels 300 is positioned at one of the second vertices P2. Moreover, the second pixels 200 and the third pixels 300 each have the same area.

As a non-limiting example, the distance (e.g., a shortest distance) between one of the first pixels 100 and an adjacent one of the second pixels 200 is a first length L1, the distance between one of the first pixels 100 and an adjacent one of the third pixels 300 is the same first length L1, and the distance between one of the second pixels 200 and an adjacent one of the third pixels 300 is the same first length L1, as shown in FIG. 1. In addition, the distance (e.g., a shortest distance) between the neighboring first pixels 100 is a second length L2 that is longer than the first length L1. It should be noted that L1, L2, L3, . . . may be used throughout to represent shortest distances between corresponding pixels.

Therefore, the gap of the first length L1 is formed between adjacent pairs of the first pixels 100 and the second pixels 200, between adjacent pairs of the first pixels 100 and the third pixels 300, and between adjacent pairs of the second pixels 200 and the third pixels 300. In addition, the gap of the second length L2 that is longer than the first length L1 is formed between the neighboring ones of the first pixels 100. This results in improved deposition reliability when using a fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, a manufacturing time and manufacturing cost of the entire OLED display may be reduced and the display quality of the image of the OLED display may be improved.

As described above, in the pixel arrangement structure of the OLED display of FIG. 1, the first pixels 100, the second pixels 200, and the third pixels 300 have polygonal shapes (e.g., the first pixels have a quadrilateral shape and the second pixels 200 and the third pixels 300 have an octagonal shape). In addition, it is worth considering that the deposition process of the organic emission layer is one of the unique manufacturing characteristics of the OLED display. Accordingly, to improve the deposition reliability of the organic emission layer in the deposition process using the fine metal mask and to improve the aperture ratio of the first pixels 100, the second pixels 200, and the third pixels 300, the center of each of the first pixels 100 is positioned at the center of a virtual square VS formed by a first pair of diagonal vertices P1 and a second pair of diagonal vertices P2. In the virtual square VS, the centers of a pair of the second pixels 200 are positioned at the first vertices P1, and the centers of a pair of the third pixels 300 are positioned at the second vertices P2.

In addition, in the pixel arrangement structure of the OLED display of FIG. 1, the first pixels 100, the second pixels 200, and the third pixels 300 respectively emit green, blue, and red light. However, in pixel arrangement structures of other OLED displays, the first pixels 100, the second pixels 200, and the third pixels 300 may emit light of different colors. For example, at least one of the second pixels 200 or the third pixels may emit white light.

Next, a pixel arrangement structure of an OLED display according to a second exemplary embodiment will be described with reference to FIG. 2. Parts that are different from the exemplary embodiment of FIG. 1 will be described, while the description of parts that are equivalent to the first exemplary embodiment may be omitted. For better comprehension and ease of description, constituent elements of the second exemplary embodiment that are the same as or similar to those of the first embodiment of FIG. 1 will have the same reference numerals.

Figure 2:
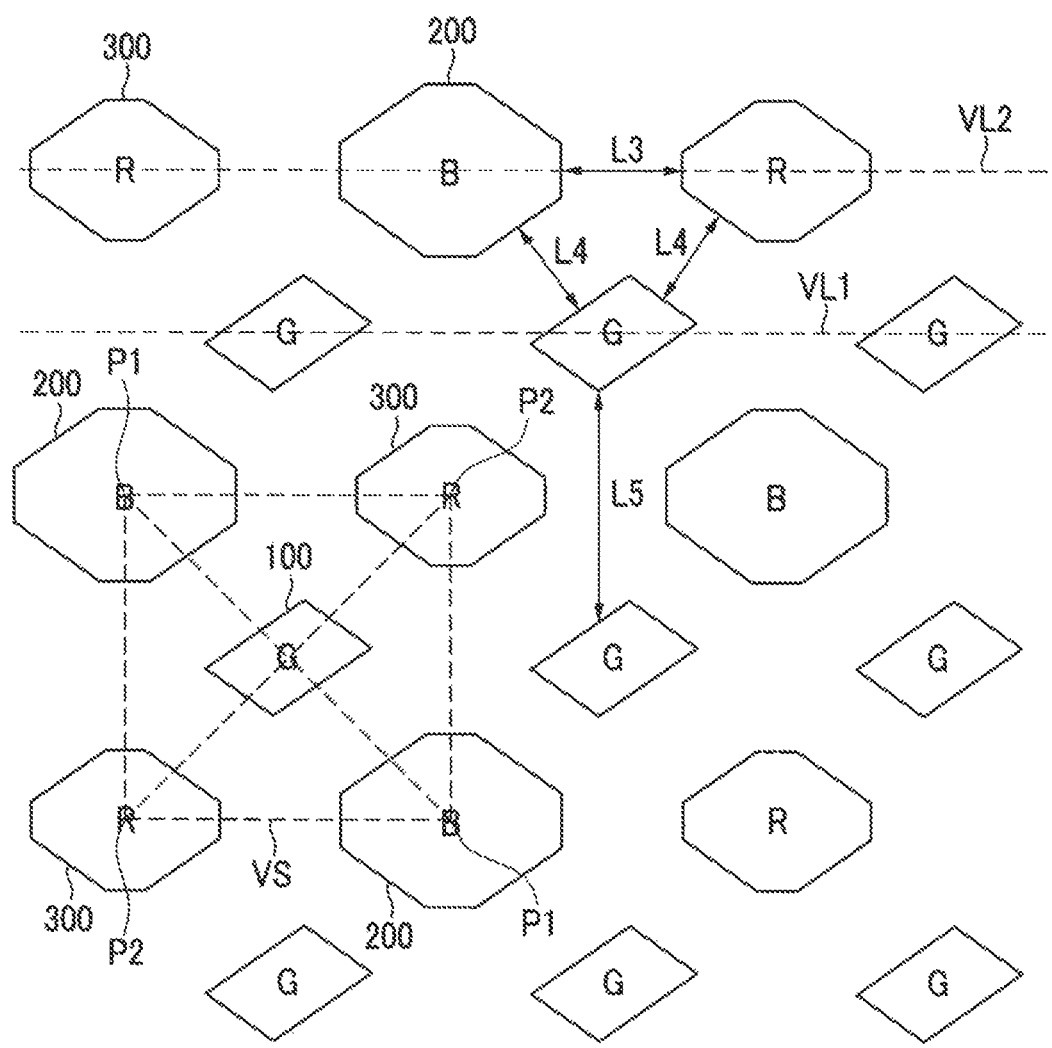
FIG. 2 is a view of a pixel arrangement structure of an OLED display according to a second exemplary embodiment.

As shown in FIG. 2, the pixel arrangement structure of the OLED display includes a plurality of first pixels 100, a plurality of second pixels 200, and a plurality of third pixels 300. The plurality of first pixels 100 have the same quadrilateral shape (e.g., a parallelogram). In addition, the second pixels 200 have a larger area than the third pixels 300. The second pixels 200 and the third pixels 300 may have polygonal shapes, such as octagonal or hexagonal (i.e., six-sided).

In a similar fashion to that of FIG. 1, the centers of a pair of the second pixels 200 are positioned at first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 2, the second pixels 200 have a larger area than the third pixels 300.

As a non-limiting example, the distance between adjacent ones of the second pixels 200 and the third pixels 300 is a third length L3, while the distance between each of the first pixels 100 and adjacent ones of the second pixels 200 or the third pixels 300 have a same fourth length L4. In addition, the distance between neighboring ones of the first pixels 100 is a fifth length L5 that is longer than the third length L3 and the fourth length L4.

Accordingly, the gap of the fourth length L4 is formed between adjacent pairs of the first pixels 100 and the second pixels 200, and between adjacent pairs of the first pixels 100 and the third pixels 300. In addition, the gap of the third length L3 is formed between adjacent pairs of the second pixels 200 and the third pixels 300. Further, the gap of the fifth length L5 that is longer than the third length L3 and the fourth length L4 is formed between the neighboring ones of the first pixels 100. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Further, in the pixel arrangement structure of the OLED display of FIG. 2, the second pixels 200 that emit blue have the shortest life span among the first pixels 100, the second pixels 200, and the third pixels 300. Accordingly, the second pixels 200 have a larger area than the third pixels 300, thereby suppressing the deterioration of the life span of the OLED display. That is, the pixel arrangement structure of the OLED display of FIG. 2 provides improved life span.

Next, a pixel arrangement structure of an OLED display according to a third exemplary embodiment will be described with reference to FIG. 3. Parts that are different from the above exemplary embodiments will be described, while the description of parts that are equivalent to the above exemplary embodiments may be omitted. For better comprehension and ease of description, constituent elements of the third exemplary embodiment that are the same as or similar to the above exemplary embodiments will have the same reference numerals.

Figure 3:
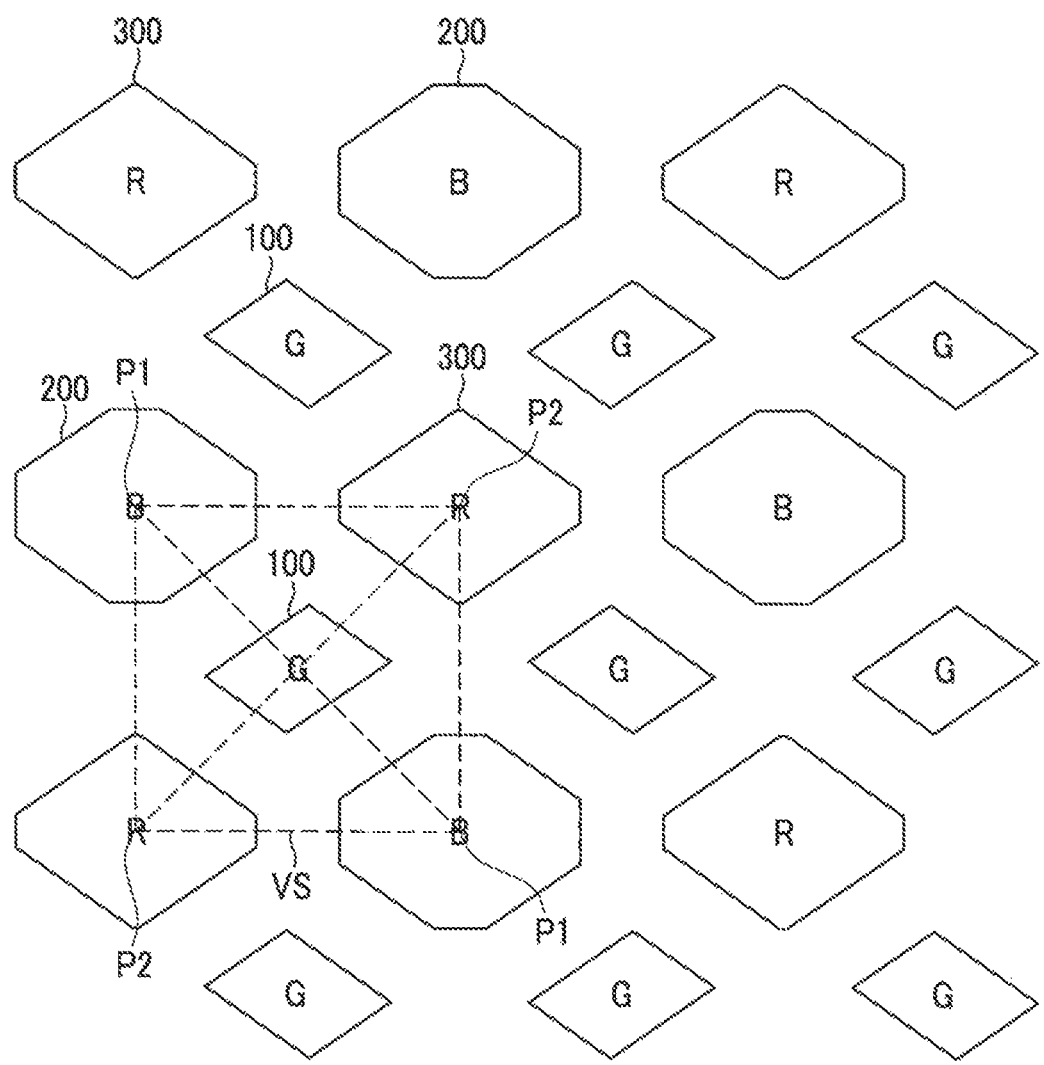
FIG. 3 is a view of a pixel arrangement structure of an OLED display according to a third exemplary embodiment.

As shown in FIG. 3, the pixel arrangement structure of the OLED display includes a plurality of first pixels 100, a plurality of second pixels 200, and a plurality of third pixels 300. Among the plurality of first pixels 100, the neighboring first pixels 100 have a quadrilateral shape (e.g., parallelogram) and are symmetrical to each other. In addition, the second pixels 200 have a larger area than the third pixels 300. The second pixels 200 and the third pixels may have polygonal shapes (e.g., hexagonal or octagonal).

In a similar fashion to that of FIGS. 1-2, the centers of a pair of the second pixels 200 are positioned at first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 3, the neighboring first pixels 100 have a quadrilateral shape and are symmetrical to each other, while the second pixels 200 have a larger area than the third pixels 300. This results in improved deposition reliability in the deposition process using the fine metal mask to form the green, blue, and red organic emission layers respectively included in the first pixels 100, the second pixels 200, and the third pixels 300.

In addition, by placing each of the first pixels 100 between a pair of the second pixels 200 and between a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Further, in the pixel arrangement structure of the OLED display of FIG. 3, the second pixels 200 that emit blue have the shortest life span among the first pixels 100, the second pixels 200, and the third pixels 300. Accordingly, the second pixels 200 have a larger area than the third pixels 300, thereby suppressing the deterioration of the life span of the OLED display. That is, the pixel arrangement structure of the OLED display provides improved life span.

Next, a pixel arrangement structure of an OLED display according to a fourth exemplary embodiment will be described with reference to FIG. 4. Parts that are different from the above exemplary embodiments will be described, while the description of parts that are equivalent to the above exemplary embodiments may be omitted. For better comprehension and ease of description, constituent elements of the fourth exemplary embodiment that are the same as or similar to the above exemplary embodiments will have the same reference numerals.

Figure 4:
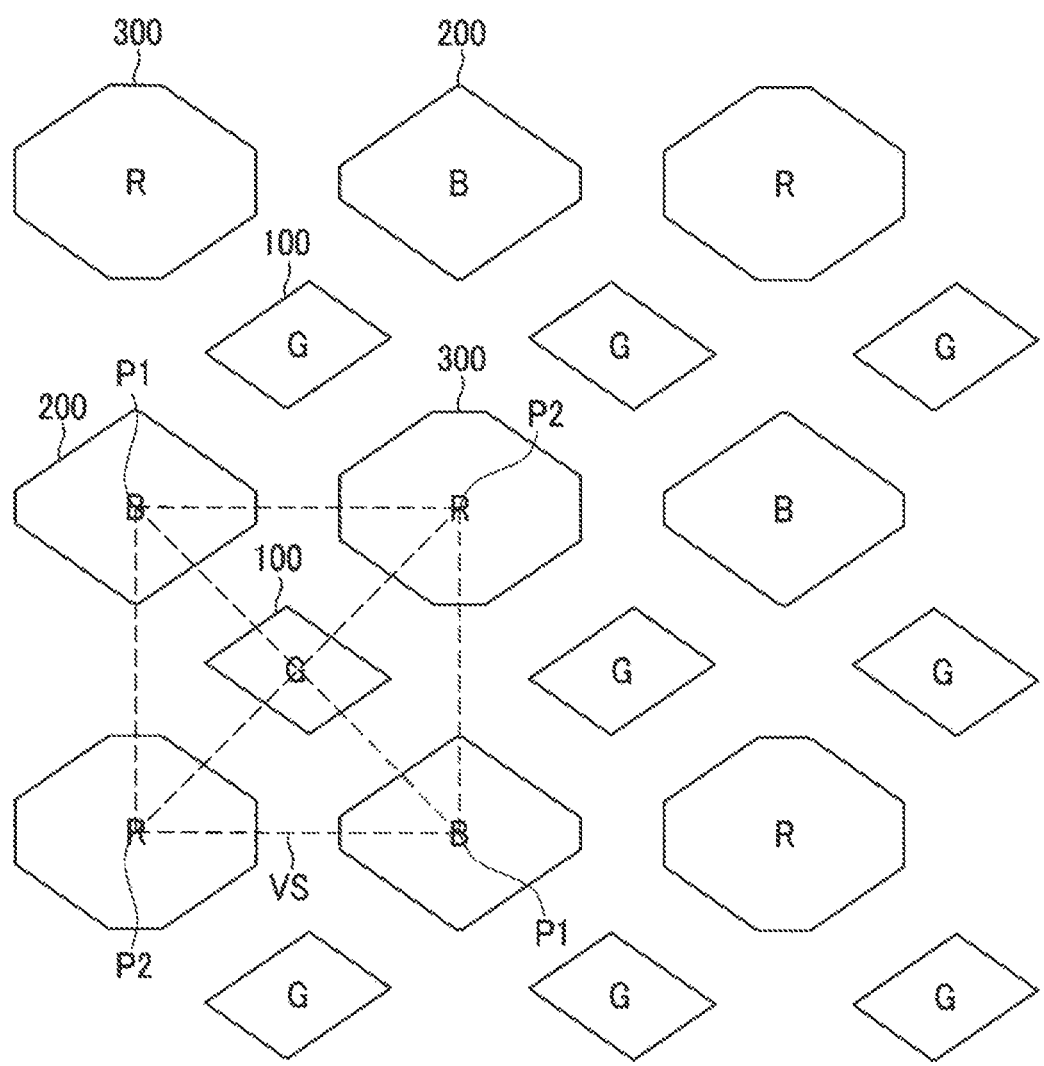
FIG. 4 is a view of a pixel arrangement structure of an OLED display according to a fourth exemplary embodiment.

As shown in FIG. 4, the pixel arrangement structure of the OLED display includes a plurality of first pixels 100, a plurality of second pixels 200, and a plurality of third pixels 300. Among the plurality of first pixels 100, the neighboring first pixels 100 have a quadrilateral shape (e.g., parallelogram) and are symmetrical to each other. In addition, the third pixels 300 have a larger area than the second pixels 200. The second pixels 200 and the third pixels may have polygonal shapes (e.g., hexagonal or octagonal).

In a similar fashion to that of FIGS. 1-3, the centers of a pair of the second pixels 200 are positioned at the first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 4, the neighboring first pixels 100 have a quadrilateral shape and are symmetrical to each other, while the third pixels 300 have a larger area than the second pixels 200. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

Next, a pixel arrangement structure of an OLED display according to a fifth exemplary embodiment will be described with reference to FIG. 5. Parts that are different from the above exemplary embodiments will be described, while the description of parts that are equivalent to the above exemplary embodiments may be omitted. For better comprehension and ease of description, constituent elements of the fifth exemplary embodiment that are the same as or similar to the above exemplary embodiments will have the same reference numerals.

Figure 5:
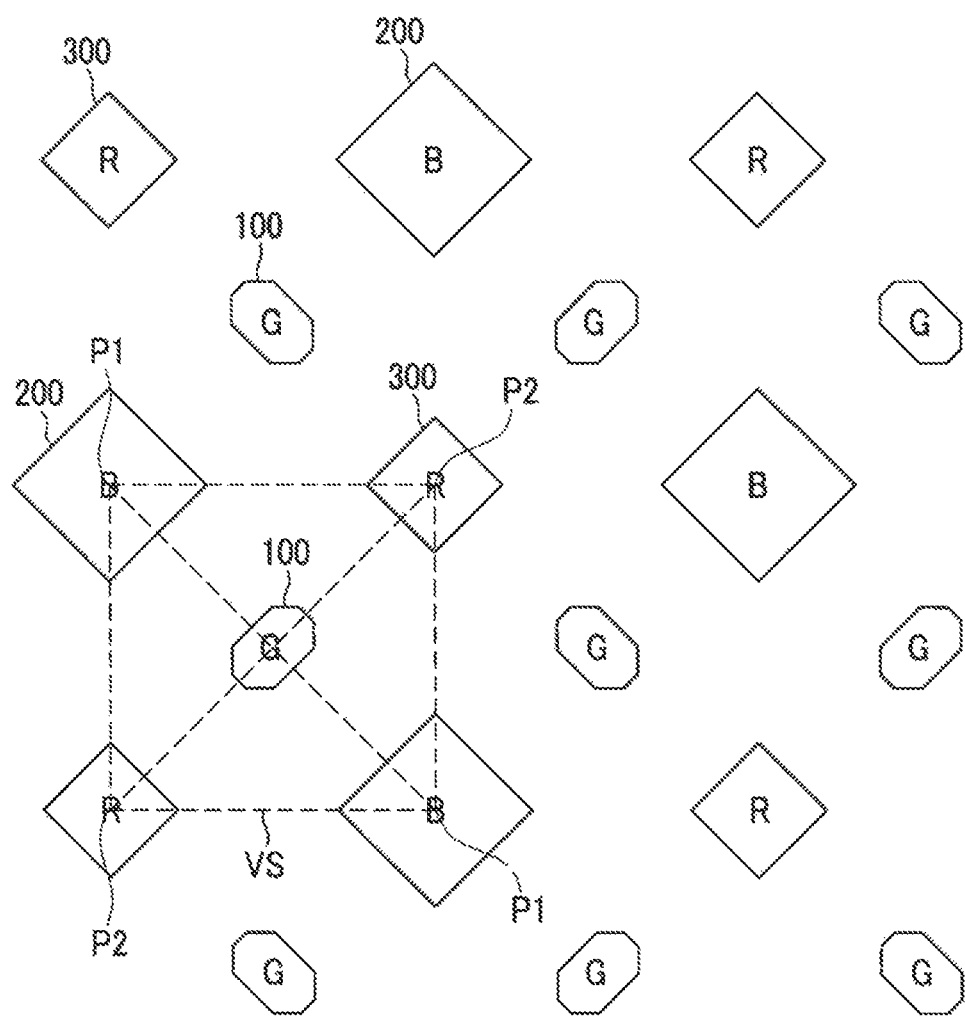
FIG. 5 is a view of a pixel arrangement structure of an OLED display according to a fifth exemplary embodiment.

As shown in FIG. 5, the pixel arrangement structure of the OLED display includes a plurality of first pixels 100, a plurality of second pixels 200, and a plurality of third pixels 300. Among the plurality of first pixels 100, the neighboring first pixels 100 have a octagonal shape and are symmetrical to each other. In addition, the second pixels 200 have a larger area than the third pixels 300. The second pixels 200 and the third pixels 300 may have quadrilateral shapes (e.g., rhombus).

In a similar fashion to that of FIGS. 1-3, the centers of a pair of the second pixels 200 are positioned at the first vertices P1 along one diagonal of a virtual square VS having a center coinciding with a center of one of the first pixels 100. In addition, the centers of a pair of the third pixels 300 are positioned at second vertices P2 along another diagonal of the virtual square VS. However, in FIG. 5, the neighboring first pixels 100 have a octagonal shape and are symmetrical to each other, while the second pixels 200 have a larger area than the third pixels 300. This results in improved deposition reliability in the deposition process using the fine metal mask to form the green, blue, and red organic emission layers respectively included in the first pixels 100, the second pixels 200, and the third pixels 300.

In addition, by enclosing each of the first pixels 100 by a pair of the second pixels 200 and a pair of the third pixels 300, the aperture ratio of the first pixels 100, the second pixels 200, and the third pixels 300 may be improved. Accordingly, the manufacturing time and the manufacturing cost of the OLED display may be reduced and the display quality of the image of the OLED display may be improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

DESCRIPTION OF SOME SYMBOLS first pixels 100, second pixels 200, third pixels 300

What is claimed is:

1. A pixel arrangement structure of an organic light emitting diode (OLED) display, the pixel arrangement structure comprising a plurality of pixels comprising:
   a plurality of first pixels;
   a plurality of second pixels; and
   a plurality of third pixels,
   wherein the OLED display comprises a pixel defining layer defining areas of the first pixels, the second pixels, and the third pixels,
   wherein the first pixels, the second pixels, and the third pixels are configured to emit different color lights,
   wherein the first pixels are arranged in first sets extending along a first direction to form respective first lines,
   wherein the second pixels and the third pixels are alternately arranged in second sets extending along the first direction to form respective second lines parallel to the first lines,
   wherein one of the second lines passes through centers of the second pixels and the third pixels in a corresponding one of the second sets and passes between the first pixels in corresponding adjacent ones of the first sets,
   wherein the first lines and the second lines are alternately arranged,
   wherein the first pixels are also arranged in third sets extending along a second direction that is perpendicular to the first direction to form respective third lines,
   wherein the second pixels and the third pixels are also alternately arranged in fourth sets extending along the second direction to form respective fourth lines that are parallel to the third lines,
   wherein the third lines and the fourth lines are alternately arranged,
   wherein the first pixels and either the second pixels or the third pixels are alternately arranged along a third direction, which crosses the first direction and the second direction,
   wherein a region having a width in the second direction that is equal to a width of the first pixels in the second direction, extending parallel to the first direction, and completely overlapping a row of the first pixels extending in the first direction, is entirely offset in the second direction from at least one of the second pixels or the third pixels in at least one of rows of the second pixels and the third pixels adjacent to the row of the first pixels, and
   wherein a shortest distance between two nearest ones of the first pixels in one of the first sets is greater than a shortest distance between one of the second pixels and one of the third pixels that are nearest each other in one of the second sets.

2. The pixel arrangement structure of claim 1, wherein one of the first lines passes between the second pixels and the third pixels in corresponding adjacent ones of the second sets.

3. The pixel arrangement structure of claim 1, wherein one of the third lines passes between the second pixels and the third pixels in corresponding adjacent ones of the fourth sets.

4. The pixel arrangement structure of claim 1, wherein one of the fourth lines passes between the first pixels in corresponding adjacent ones of the third sets.

5. The pixel arrangement structure of claim 1, wherein a shortest distance between the first pixels and the second pixels, and a shortest distance between the first pixels and the third pixels, are a same first length.

6. The pixel arrangement structure of claim 1, wherein the first pixels are configured to emit green light, the second pixels are configured to emit blue light, and the third pixels are configured to emit red light.

7. The pixel arrangement structure of claim 1, wherein each of the second pixels has a same area as each of the third pixels.

8. The pixel arrangement structure of claim 7, wherein a shortest distance between the first pixels and the second pixels, a shortest distance between the second pixels and the third pixels, and a shortest distance between the first pixels and the third pixels, are a same first length.

9. The pixel arrangement structure of claim 8, wherein a shortest distance between neighboring ones of the plurality of first pixels is a second length that is greater than the first length.

10. The pixel arrangement structure of claim 1, wherein each of the second pixels has a larger area than each of the third pixels.

11. The pixel arrangement structure of claim 1, wherein each of the third pixels has a larger area than each of the second pixels.

12. The pixel arrangement structure of claim 1, wherein the first pixels, the second pixels, and the third pixels have polygonal shapes.

13. The pixel arrangement structure of claim 12, wherein neighboring ones of the plurality of first pixels have octagonal shapes that are symmetrical to each other.

14. The pixel arrangement structure of claim 12, wherein the second pixels and the third pixels have octagonal shapes.

15. The pixel arrangement structure of claim 14, wherein each of the second pixels have a same octagonal shape.

16. The pixel arrangement structure of claim 14, wherein each of the third pixels have a same octagonal shape.

17. The pixel arrangement structure of claim 1, wherein each of the first pixels has a smaller area than the second pixels and the third pixels.

18. The pixel arrangement structure of claim 1, wherein:
   some of the second pixels are spaced from, and alternately arranged with, some of the first pixels in a fifth set of pixels aligned along the third direction;
   the third pixels are spaced from the first pixels and the second pixels;
   some of the third pixels are alternately arranged with some of the first pixels in a sixth set of pixels aligned along a fourth direction crossing the third direction;
   the fifth set of pixels and the sixth set of pixels intersect at one of the first pixels that is in both the fifth set and the sixth set; and
   the first pixels are different in size from at least one of the second pixels or the third pixels.

19. The pixel arrangement structure of claim 18, wherein the first pixels are configured to produce green light, wherein the second pixels are configured to produce blue light, and wherein the third pixels are configured to produce red light.

20. The pixel arrangement structure of claim 18, wherein the first pixels are smaller in size than at least one of the second pixels or the third pixels.

21. The pixel arrangement structure of claim 18, wherein the second pixels are different in size from the third pixels.

22. The pixel arrangement structure of claim 18, wherein a shortest distance between two adjacent ones of the first pixels is greater than a shortest distance between one of the second pixels and one of the third pixels that is adjacent to the one of the second pixels, and wherein the shortest distance between the two adjacent ones of the first pixels is different from a shortest distance between two adjacent ones of the second pixels.

23. The pixel arrangement structure of claim 1, wherein:
the plurality of second pixels comprises a first second pixel, a second second pixel, and a third second pixel;
each of the second pixels is configured to produce light having a second color;
the plurality of third pixels comprises a first third pixel, a second third pixel, and a third third pixel;
each of the third pixels is configured to produce light having a third color that is different from the second color;
the first second pixel, the first third pixel, the second second pixel, and the second third pixel form a first virtual quadrangle,
the second second pixel, the second third pixel, the third second pixel, and the third third pixel form a second virtual quadrangle;
the plurality of first pixels comprises a first first pixel in the first virtual quadrangle and a second first pixel in the second virtual quadrangle;
the first and second virtual quadrangles share a common side having endpoints at a common first vertex and a common second vertex of the first and second virtual quadrangles,
the second second pixel is arranged at the common first vertex, and the second third pixel is arranged at the common second vertex;
the plurality of first pixels further comprises a third first pixel;
the first first pixel and the third first pixel are located at opposite sides of the second second pixel;
each of the first pixels is configured to produce light having a first color that is different from the second color and the third color; and
the second pixels are larger in area than the first pixels and the third pixels.

24. The pixel arrangement structure of claim 23, wherein a first virtual line extending in the second direction, crossing a center of a second virtual line extending from the first third pixel to the second second pixel, and being perpendicular to the second virtual line, passes through the first first pixel.

25. The pixel arrangement structure of claim 23, wherein a first virtual line extending in the second direction, crossing a center of a second virtual line extending from the second second pixel to the third third pixel, and being perpendicular to the second virtual line, passes through the second first pixel.

26. The pixel arrangement structure of claim 23, wherein centers of two or more of the first pixels are aligned with each other along the first direction.

27. The pixel arrangement structure of claim 23, wherein centers of at least one of the second pixels and at least one of the third pixels are aligned with each other along the second direction.

28. The pixel arrangement structure of claim 1, wherein:
some of the second pixels are spaced from and alternately arranged with respective ones of the first pixels in a fifth set of pixels aligned along a fourth direction crossing the third direction from among the plurality of pixels;
the plurality of third pixels is spaced from the first pixels and the second pixels;
some of the third pixels are alternately arranged with other respective ones of the first pixels in a sixth set of pixels aligned along the third direction;
the fifth set of pixels and the sixth set of pixels intersect at one of the first pixels that corresponds to both the fifth set and the sixth set;
some of the first pixels and some of the third pixels are alternately arranged in a seventh set of pixels aligned along the fourth direction and an eighth set of pixels aligned along the third direction; and
the seventh set of pixels and the eighth set of pixels are located at sides of the fifth set of pixels.

29. The pixel arrangement structure of claim 28, wherein centers of one of the first pixels in the fifth set of pixels and one of the first pixels in the seventh set of pixels are aligned along the second direction.

30. The pixel arrangement structure of claim 28, wherein some of the first pixels and some of the second pixels are alternately arranged in each of a ninth set of pixels aligned along the fourth direction and a tenth set of pixels aligned along the fourth direction.

31. The pixel arrangement structure of claim 30, wherein the first pixels in the ninth set of pixels are arranged along the fourth direction, and wherein the second pixels in the ninth set of pixels are arranged along the fourth direction.

32. The pixel arrangement structure of claim 30, wherein the ninth set of pixels and the tenth set of pixels are arranged symmetrically with each other with respect to a column of ones of the first pixels and the third pixels extending in the fourth direction.

33. The pixel arrangement structure of claim 28, wherein:
a shortest distance between two adjacent ones of the first pixels is greater than a shortest distance between one of the second pixels and one of the third pixels that is adjacent to the one of the second pixels; and
the shortest distance between the two adjacent ones of the first pixels is different from a shortest distance between two adjacent ones of the second pixels.

34. The pixel arrangement structure of claim 1, wherein:
the plurality of second pixels comprises a first second pixel, a second second pixel, and a third second pixel;
each of the second pixels is configured to produce light having a second color;
the plurality of third pixels comprises a first third pixel, a second third pixel, and a third third pixel;
each of the third pixels is configured to produce light having a third color that is different from the second color;
the first second pixel, the first third pixel, the second second pixel, and the second third pixel form a first virtual quadrangle;
the second second pixel, the second third pixel, the third second pixel, and the third third pixel form a second virtual quadrangle;
the plurality of first pixels comprises a first first pixel in the first virtual quadrangle, and a second first pixel in the second virtual quadrangle;
the first and second virtual quadrangles share a common side having endpoints at a common first vertex and a common second vertex of the first and second virtual quadrangles; and
the second second pixel is arranged at the common first vertex, and the second third pixel is arranged at the common second vertex.

35. The pixel arrangement structure of claim 34, wherein centers of the first second pixel and the second third pixel are aligned with each other along the first direction.

36. The pixel arrangement structure of claim 34, wherein:
the plurality of first pixels further comprises a third first pixel;
the plurality of second pixels further comprises a fourth second pixel;
the plurality of third pixels further comprises a fourth third pixel;
the first third pixel, the second second pixel, the fourth second pixel, and the fourth third pixel form a third virtual quadrangle in the second direction from the first virtual quadrangle; and
the third first pixel is located in the third virtual quadrangle.

37. The pixel arrangement structure of claim 36, wherein centers of the first first pixel and the third first pixel are aligned with each other along the second direction.

38. The pixel arrangement structure of claim 36, wherein the first virtual quadrangle and the third virtual quadrangle have a common side, and
wherein the first first pixel and the third first pixel are symmetrical to each other along the second direction with respect to the common side.

39. The pixel arrangement structure of claim 1, wherein each of the first pixels has a non-quadrilateral polygonal shape.

40. The pixel arrangement structure of claim 1,
wherein each of the first pixels has two elongated sides that are elongated in the third direction or a fourth direction crossing the third direction and different from the first and second directions, and two connection portions that connect the two elongated sides to each other at respective ends, and
wherein at least one of the two connection portions has a length that is greater than a shortest distance between the two elongated sides.

41. The pixel arrangement structure of claim 1, wherein a shortest distance between two elongated sides of one of the first pixels is less than a shortest distance between the one of the first pixels and a nearest one of the second pixels in the third direction or a fourth direction crossing the third direction.

42. A pixel arrangement structure of an organic light emitting diode (OLED) display, the pixel arrangement structure comprising:
a plurality of first pixels;
a plurality of second pixels; and
a plurality of third pixels,
wherein the OLED display comprises a pixel defining layer defining areas of the first pixels, the second pixels, and the third pixels,
wherein the first pixels, the second pixels, and the third pixels are configured to emit different color lights,
wherein the first pixels are arranged in first sets extending along a first direction to form respective first lines,
wherein the second pixels and the third pixels are alternately arranged in second sets extending along the first direction to form respective second lines parallel to the first lines,
wherein the first lines and the second lines are alternately arranged,
wherein the first pixels are also arranged in third sets extending along a second direction that is perpendicular to the first direction to form respective third lines,
wherein the second pixels and the third pixels are also alternately arranged in fourth sets extending along the second direction to form respective fourth lines that are parallel to the third lines,
wherein the third lines and the fourth lines are alternately arranged,
wherein respective ones of the first pixels and respective ones of either the second pixels or the third pixels are alternately arranged along a third direction, which crosses the first direction and the second direction,
wherein each of the second pixels has a larger area than each of the third pixels,
wherein a distance between centers of neighboring pixels of the second pixels and the third pixels is a first length,
wherein a distance between centers of neighboring pixels of the first pixels and the second pixels, and a distance between centers of neighboring pixels of the first pixels and the third pixels are a second length,
wherein a distance between centers of neighboring pixels of the first pixels is a third length that is greater than the second length, and
wherein a shortest distance between two nearest ones of the first pixels in one of the first sets is greater than a shortest distance between one of the second pixels and one of the third pixels that are nearest each other in one of the second sets.

43. The pixel arrangement structure of claim 42,
wherein each of the first pixels has two parallel sides that are elongated in the third direction or a fourth direction crossing the third direction and two connection portions that connect the two parallel sides to each other at respective ends, and
wherein at least one of the two connection portions has a length that is greater than a shortest distance between the two parallel sides.

44. The pixel arrangement structure of claim 42, wherein a shortest distance between two elongated sides of one of the first pixels is less than a shortest distance between the one of the first pixels and a nearest one of the second pixels in the third direction or a fourth direction crossing the third direction.

45. A pixel arrangement structure of an organic light emitting diode (OLED) display, the pixel arrangement structure comprising:
a plurality of first pixels, wherein the first pixels have a shape comprising edges;
a plurality of second pixels; and
a plurality of third pixels,
wherein the OLED display comprises a pixel defining layer defining areas of the first pixels, the second pixels, and the third pixels,
wherein the first pixels, the second pixels, and the third pixels are configured to emit different color lights,
wherein only one of the second pixels and the third pixels is included in a virtual quadrangle containing outer edges comprising some of the edges of a group of four neighboring ones of the plurality of first pixels, all portions of all others of the second pixels and the third pixels being outside of the virtual quadrangle, and
wherein a shortest distance between any two of the group of four neighboring ones of the plurality of first pixels is greater than a shortest distance between the only one of the second pixels and the third pixels included in the virtual quadrangle and a nearest one of the second pixels or the third pixels in a direction perpendicular to any side of the virtual quadrangle.

46. The pixel arrangement structure of claim 45, wherein the first pixels are configured to emit green light.

47. The pixel arrangement structure of claim 45, wherein the virtual quadrangle does not cross any other of the first pixels, the second pixels, or the third pixels.

48. The pixel arrangement structure of claim 45, wherein each of the first pixels, the second pixels, and the third pixels comprises an anode, a cathode, and an organic emission layer, at least one of the anode, the cathode, or the organic emission layer partially overlapping the pixel defining layer in a plan view.

49. The pixel arrangement structure of claim 45, wherein each of the first pixels, the second pixels, and the third pixels comprises an anode, a cathode, and an organic emission layer, and
wherein the organic emission layer is formed utilizing a fine metal mask.

50. The pixel arrangement structure of claim 45, wherein the first pixels have a polygonal shape different from a quadrilateral shape.

51. The pixel arrangement structure of claim 45,
wherein two parallel edges from among the edges of each of the first pixels are elongated in a first direction or a second direction crossing the first direction,
wherein remaining edges from among the edges of each of the first pixels connect respective first ends of the two parallel edges to each other and connect respective second ends of the two parallel edges to each other, and
wherein a total length of the remaining edges between at least one of the first ends or the second ends is greater than a shortest distance between the two parallel edges.

52. The pixel arrangement structure of claim 45, wherein a shortest distance between two parallel edges that are elongated in a first direction or a second direction crossing the first direction from among the edges of one of the group of four neighboring ones of the plurality of first pixels is less than a shortest distance between the one of the group of four neighboring ones of the plurality of first pixels and the only one of the second pixels and the third pixels included in the virtual quadrangle.

53. A display comprising:
a plurality of first pixel rows, each of the first pixel rows comprising a plurality of first pixels arranged along a first direction;
a plurality of second pixel rows alternately arranged with the plurality of first pixel rows along a second direction crossing the first direction, each of the second pixel rows comprising a plurality of second pixels and a plurality of third pixels that are alternately arranged along the first direction;
a plurality of first pixel groups, each of the first pixel groups comprising a first one of the first pixels and one of the second pixels neighboring the first one of the first pixels; and
a plurality of second pixel groups, each of the second pixel groups comprising a second one of the first pixels and one of the third pixels neighboring the second one of the first pixels,
wherein the first pixel groups and the second pixel groups are alternately arranged along the first direction,
wherein a shortest distance between two nearest ones of the first pixels in the second direction is greater than a width in the second direction of at least one of the second pixels or the third pixels, and
wherein a shortest distance between two nearest ones of the first pixels in one of the first pixel rows is greater than a shortest distance between one of the second pixels and one of the third pixels that are nearest each other in one of the second pixel rows.

54. The display of claim 53, wherein the first pixel groups and the second pixel groups are alternately arranged along the second direction.

55. The display of claim 53, wherein:
the first pixels are arranged on a plurality of first pixel columns extending in the second direction;
the second pixels and the third pixels are alternately arranged on a plurality of second pixel columns extending in the second direction; and
the first pixel columns and the second pixel columns are alternately arranged along the first direction.

56. The display of claim 53, wherein:
the first pixel groups are arranged in a plurality of first pixel sets along a first diagonal direction crossing the first direction and the second direction;
the second pixel groups are arranged in a plurality of second pixel sets along the first diagonal direction; and
the first pixel sets and the second pixel sets are alternately arranged along a second diagonal direction crossing the first diagonal direction.

57. The display of claim 56, wherein the first pixels and the second pixels in the first pixel sets are alternately arranged along the first diagonal direction.

58. The display of claim 56, wherein the first pixels and the third pixels in the second pixel sets are alternately arranged along the first diagonal direction.

59. The display of claim 56, wherein the first pixel groups are arranged in a plurality of third pixel sets along the second diagonal direction, wherein the second pixel groups are arranged in a plurality of fourth pixel sets along the second diagonal direction, and wherein the third pixel sets and the fourth pixel sets are alternately arranged along the first diagonal direction.

60. The display of claim 59, wherein the first pixels in the first pixel groups are elongated in the second diagonal direction, and wherein the first pixels in the second pixel groups are elongated in the first diagonal direction.

61. The display of claim 53, wherein a virtual quadrangle formed by centers of two adjacent ones of the first pixels and centers of one of the second pixels and one of the third pixels that are adjacent to the two adjacent ones of the first pixels has a rhombus shape.

62. The display of claim 53, wherein each of the first pixels has two parallel sides that are elongated in a first diagonal direction crossing the first direction and the second direction or a second diagonal direction crossing the first diagonal direction, and
wherein the two parallel sides are parallel to at least one side of the second pixels or the third pixels.

63. The display of claim 53, wherein each of the first pixels has two parallel sides that are elongated in a first diagonal direction crossing the first direction and the second direction or a second diagonal direction crossing the first diagonal direction, and two connection portions that connect the two parallel sides to each other at respective ends, and
wherein at least one of the two connection portions has a length that is greater than a shortest distance between the two parallel sides.

64. The display of claim 53, wherein the first pixels and the second pixels are alternately arranged along a first diagonal direction crossing the first direction and the second direction, and
wherein an imaginary line extending in the first direction through upper edges or lower edges of ones of the second pixels overlaps only the ones of the second pixels, the upper edges and the lower edges being defined with respect to the second direction.

65. The display of claim 53, wherein each of the third pixels is larger than any of the first pixels, and wherein each of the second pixels is larger than any of the first pixels and the third pixels.

66. The display of claim 53, wherein a shortest distance between two elongated sides of one of the first pixels is less than a shortest distance between the one of the first pixels and a nearest one of the second pixels in a first diagonal direction crossing the first direction and the second direction, or a second diagonal direction crossing the first diagonal direction.

67. A display comprising a plurality of pixels for displaying an image, the plurality of pixels comprising:
a plurality of first pixels to produce light of a first color;
a plurality of second pixels to produce light of a second color different from the first color; and
a plurality of third pixels to produce light of a third color different from the first color and the second color,
wherein the plurality of pixels is organized into a plurality of first pixel rows and a plurality of second pixel rows that are alternately arranged along a column direction,
wherein each of the first pixel rows comprises some of the first pixels and some of the second pixels that are alternately arranged along a row direction substantially perpendicular to the column direction,
wherein each of the second pixel rows comprises some of the first pixels and some of the third pixels that are alternately arranged along the row direction,
wherein the first pixels in the second pixel rows are entirely outside a region extending in the row direction and completely overlapping the first pixels in one of the first pixel rows that is adjacent to the second pixel rows, and
wherein a shortest distance between two nearest ones of the first pixels in a third direction crossing the row direction and the column direction is greater than a shortest distance between one of the second pixels and one of the third pixels that are nearest each other in the third direction.

68. The display of claim 67, wherein:
the first pixels and the second pixels are alternately arranged along the column direction in a plurality of first pixel columns;
the first pixels and the third pixels are alternately arranged along the column direction in a plurality of second pixel columns; and
the first pixel columns and the second pixel columns are alternately arranged along the row direction.

69. The display of claim 68, wherein centers of the first pixels on the first pixel columns are aligned in the column direction.

70. The display of claim 68, wherein centers of the first pixels on the second pixel columns are aligned in the column direction.

71. The display of claim 68, wherein a shortest distance between neighboring ones of the pixels on the first pixel rows is the same as a shortest distance between neighboring ones of the pixels on the first pixel columns.

72. The display of claim 68, wherein each of the first pixels is at an intersection of one of the first pixel rows and one of the second pixel columns only, or at an intersection of one of the second pixel rows and one of the first pixel columns only.

73. The display of claim 68, wherein:
centers of corresponding ones of the second pixels are aligned in the first pixel rows and in the first pixel columns; and
centers of corresponding ones of the third pixels are aligned in the second pixel rows and in the second pixel columns.

74. The display of claim 73, wherein:
two neighboring ones of the pixels on one of the first pixel rows and two neighboring ones of the pixels on one of the second pixel rows adjacent to the one of the first pixel rows form a virtual square; and
only the two neighboring ones of the pixels on the one of the first pixel rows and the two neighboring ones of the pixels on the one of the second pixel rows are in an area of the virtual square.

75. The display of claim 67, wherein:
each of the first pixel rows comprises a plurality of first pixel groups, each of the first pixel groups consisting of one of the first pixels and one of the second pixels adjacent to the one of the first pixels on a corresponding first pixel row; and
each of the second pixel rows comprises a plurality of second pixel groups, each of the second pixel groups consisting of one of the first pixels and one of the third pixels adjacent to the one of the first pixels on a corresponding second pixel row.

76. The display of claim 67, wherein centers of corresponding ones of the first pixels on the first pixel rows are aligned in the row direction.

77. The display of claim 67, wherein centers of corresponding ones of the first pixels on the second pixel rows are aligned in the row direction.

78. The display of claim 67, wherein all of the pixels on the second pixel rows are offset entirely in the column direction from the first pixels on the first pixel rows.

79. The display of claim 67, wherein a shortest distance between neighboring ones of the pixels on the first pixel rows is the same as a shortest distance between neighboring ones of the pixels on the second pixel rows.

80. The display of claim 67, wherein the first color is green, the second color is blue, and the third color is red.

81. The display of claim 67,
wherein each of the first pixels has two parallel sides that are elongated in the row direction or the column direction, and two connection portions that connect the two parallel sides to each other at respective ends of the two parallel sides, and
wherein at least one of the two connection portions has a length that is greater than a shortest distance between the two parallel sides.

82. The display of claim 67, wherein an imaginary line extending in the row direction through upper edges or lower edges of ones of the second pixels overlaps only the ones of the second pixels, the upper edges and the lower edges being defined with respect to the column direction.

83. The display of claim 67, wherein each of the third pixels is larger than any of the first pixels, and wherein each of the second pixels is larger than any of the first pixels and the third pixels.

84. The display of claim 67, wherein a shortest distance between two parallel sides that are elongated in the row direction of one of the first pixels is less than a shortest distance between one of the two parallel sides and a nearest one of the second pixels in the column direction.

85. A display comprising:
a plurality of first pixel rows, each of the first pixel rows comprising a plurality of first pixels arranged along a first direction;
a plurality of second pixel rows alternately arranged with the plurality of first pixel rows along a second direction crossing the first direction, each of the second pixel rows comprising a plurality of second pixels and a plurality of third pixels that are alternately arranged along the first direction;

a plurality of first pixel groups, each of the first pixel groups comprising a first one of the first pixels and one of the second pixels neighboring the first one of the first pixels; and a plurality of second pixel groups, each of the second pixel groups comprising a second one of the first pixels and one of the third pixels neighboring the second one of the first pixels, wherein the first pixel groups and the second pixel groups are alternately arranged along the first direction, wherein each of the first pixels is elongated in a first diagonal direction crossing the first direction and the second direction or a second diagonal direction crossing the first diagonal direction and has two parallel sides, and two connection portions that connect the two parallel sides to each other at respective ends, and wherein at least one of the two connection portions has a length that is greater than a shortest distance between the two parallel sides.

86. The display of claim 85, wherein the first pixel groups and the second pixel groups are alternately arranged along the second direction.

87. The display of claim 85, wherein:

the first pixels are arranged on a plurality of first pixel columns extending in the second direction;

the second pixels and the third pixels are alternately arranged on a plurality of second pixel columns extending in the second direction; and the first pixel columns and the second pixel columns are alternately arranged along the first direction.

88. The display of claim 85, wherein:

the first pixel groups are arranged in a plurality of first pixel sets along the first diagonal direction;

the second pixel groups are arranged in a plurality of second pixel sets along the first diagonal direction; and the first pixel sets and the second pixel sets are alternately arranged along the second diagonal direction.

89. A display comprising a plurality of pixels for displaying an image, the plurality of pixels comprising:

a plurality of first pixels to produce light of a first color;

a plurality of second pixels to produce light of a second color different from the first color; and a plurality of third pixels to produce light of a third color different from the first color and the second color, wherein the plurality of pixels is organized into a plurality of first pixel rows and a plurality of second pixel rows that are alternately arranged along a column direction, wherein each of the first pixel rows comprises some of the first pixels and some of the second pixels that are alternately arranged along a row direction substantially perpendicular to the column direction, wherein each of the second pixel rows comprises some of the first pixels and some of the third pixels that are alternately arranged along the row direction, wherein each of the first pixels is elongated in the row direction or the column direction and has two parallel sides, and two connection portions that connect the two parallel sides to each other at respective ends of the two parallel sides, and wherein at least one of the two connection portions has a length that is greater than a shortest distance between the two parallel sides.

90. The display of claim 89, wherein:

the first pixels and the second pixels are alternately arranged along the column direction in a plurality of first pixel columns;

the first pixels and the third pixels are alternately arranged along the column direction in a plurality of second pixel columns; and the first pixel columns and the second pixel columns are alternately arranged along the row direction.

91. The display of claim 90, wherein a shortest distance between neighboring ones of the pixels on the first pixel rows is the same as a shortest distance between neighboring ones of the pixels on the first pixel columns.

92. The display of claim 89, wherein a shortest distance between neighboring ones of the pixels on the first pixel rows is the same as a shortest distance between neighboring ones of the pixels on the second pixel rows.

* * * * *